United States Patent [19]

Yanagida

[11] Patent Number: 5,362,350
[45] Date of Patent: Nov. 8, 1994

[54] METHOD FOR ETCHING IN DRY PROCESS

[75] Inventor: Toshiharu Yanagida, Kanagawa, Japan

[73] Assignee: Sony Corporation, Tokyo, Japan

[21] Appl. No.: 156,837

[22] Filed: Nov. 24, 1993

[30] Foreign Application Priority Data

Nov. 24, 1992 [JP] Japan .................................. 4-313325

[51] Int. Cl.⁵ .......................... B44C 1/22; C23F 1/00
[52] U.S. Cl. .................................... 156/643; 156/646; 156/656; 156/659.1; 156/666
[58] Field of Search ............ 156/643, 646, 656, 659.1, 156/666, 904; 204/192.2, 192.35

[56] References Cited

U.S. PATENT DOCUMENTS

| | | | |
|---|---|---|---|
| 5,200,032 | 4/1993 | Shinohara | 156/666 X |
| 5,277,757 | 1/1994 | Sato | 156/643 X |
| 5,281,304 | 1/1994 | Kadomura | 156/656 |

*Primary Examiner*—William Powell
*Attorney, Agent, or Firm*—Hill, Steadman & Simpson

[57] ABSTRACT

A method for etching a copper layer in dry process includes the steps of forming a copper layer on a substrate, heating the substrate, etching the copper layer while using an etching gas. The etching gas includes iodine halide such as pentafuluoride, ioeine heptafuluoride, iodine monochloride and iodine trichloride. The copper layer is etched while sublimating cuprous iodide of a reaction product.

14 Claims, 1 Drawing Sheet

METHOD FOR ETCHING IN DRY PROCESS

FIELD OF THE INVENTION

This invention relates to a method for etching a copper layer in dry process for preparing a semiconductor device. More particularly this invention relates to a method for forming a copper wiring pattern having a high reliability in a wafer temperature range which a resist mask can be used.

BACKGROUND OF THE INVENTION

Recently a semiconductor tends to become high integration and high performance such as Very Large Scale Integration (VLSI) or Ultra Large Scale Integration (ULSI). Therefore a design rule of wiring pattern also tends to become fine such as submicron or quartermicron. Aluminum (Al) has been used as a wiring material in a semiconductor device. In this specification, aluminum (Al) means pure aluminum or a material, mainly including Aluminum. But aluminum wiring is easy to deteriorate a reliability owing to a deterioration of an electro-migration durability and/or a stress-migration durability when a wiring width is smaller than 0.5 μm. Further a layer of a wiring becomes thick in order to get a low resistance. It makes an aspect ratio of a wiring pattern large such as from 1 to 2. It makes difficult to flat by a insulation layer in the latter process.

Thus because aluminum wiring has some problems as stated above, copper (Cu) wiring is used preferably. In this specification, copper (Cu) means pure copper or a material mainly including copper. Copper has a high electro-migration durability. The electric resistivity of pure copper is about 1.4 μΩcm. It is about a half of the electric resistivity of pure aluminum. Therefore even though a wiring pattern of copper has the same width as a wiring pattern of aluminum has, a thickness of a copper film becomes thinner than a thickness of a aluminum film. It is advantageous to form a multi-film wiring.

But there are some problems to etch copper in dry process. The research for fine processing of copper is on the way.

Copper is very easy to be oxidized. A surface of copper is always covered by copper oxide (CuO) and a passive state. When copper oxide exists on a surface of copper, copper oxide obstructs a reaction between an etching gas and copper. It declines an etching velocity. And because copper oxide acts on copper as a mask, a spot of copper and/or copper oxide on a wafer is remained after an etching.

Further it is difficult for chloric gas used as an etching gas of aluminum to etch copper, because a vapor pressure of cuprous chloride being a reaction product is very low.

Some ideas have been suggested in order to solve these problems until now.

For instance, Japanese Journal of Applied Physics., Vol. 28, No. 6, p. L1070–1072 (1989) shows a reactive ion etching that a copper thin film is etched by a mixed gas of silicon tetrachloride (SiCl4) and Nitrogen (N2) while heating a wafer at the approximate temprature of 250° C. This heating prevents a spot of copper and/or copper oxide from remaining on a wafer after an etching. The reactive product silicon nitride (SixNy) in a gaseous phase is utilized as a side wall protector, and anisotropic processing is performed.

Japanese laid open patent Hei 1-234578 shows that hydrogen (H2) of some percentages is added into an etching gas. Though copper oxide is produced at a surface of copper by a reaction with residual oxide at a high temperature, copper oxide is reduced by H2 added into an etching gas. Therefore copper is smoothly etched in dry process.

Further Japanese laid open patent Hei 3-295232 shows that a mixed gas of nitrogen (N2) and oxygen (O2), a gas having an oxygen atom and a nitrogen atom in a molecule and/or fluorine gas is added into an etching gas while heating a wafer at the temperature of less than 200° C. Copper is sublimated in the form of copper nitrate ( Cu(NO3)2 ) and removed in this process.

However the ideas stated above have some problems which must be solved.

At first, silicon nitride (SixNy) may be possible to be a particle contamination source when silicon nitride (SixNy) is utilized as a side wall protector.

Further when silicon nitride (SixNy) is utilized as a side wall protector or the copper oxide is reduced by H2 added into an etching gas, it is necessary to heat a wafer at a high temperature. It is impossible to use a resist mask as a etching mask at the high temperature. So heat-resisting material such as silicon dioxide (SiO2) is utilized as an etching mask. But it is difficult to remove the mask of silicon dioxide after etching because there is few solvent to have a selectivity between silicon dioxide and a interlaminar insulating film. If the mask of silicon dioxide is utilized as a part of a interlaminar insulating film without removing of the mask, surface steps of the wafer increase. A forming of an etching mask is an extra process itself. Further a heating of a wafer at a high temperature accelerates forming of a copper oxide film by residual oxygen in a chamber.

Meanwhile in the method of removing copper as copper nitrate, there is no active material of halogen in an etching reaction system. It means that a selective rate between a mask pattern and a interlaminar insulating film becomes large. Further it is advantageous that a resist mask is utilized as a etching mask, because a wafer is heated at a low temperature. But because an etching gas includes oxygen, a copper oxide film is formed on a surface of copper. An oxygen atom diffuses inside at the place formed a copper oxide film. It causes problems that a spot of copper and/or copper oxide remains on a wafer after an etching and a wiring resistance increases.

SUMMARY OF THE INVENTION

One object of this invention is to provide a method for etching a copper layer in dry process which forms a copper wiring patttern having a high reliability.

According to a first embodiment of this invention, a method for etching a copper layer in dry process includes the steps of forming a copper layer on a substrate, heating the substrate and etching the copper layer while using an etching gas. The etching gas includes a iodine halide.

According to a second embodiment of this invention, a method for etching a copper layer in dry process includes the steps of forming a copper layer on a substrate, heating the substrate, the first etching for etching the copper layer until it is just before an etched depth is the same as a thickness of the copper layer while using an etching gas. Further the method includes the step of second etching for etching a residual copper while using an etching gas. The etching gas for the first etching includes a iodine halide. The etching gas for the second etching includes a iodine halide and a bromide gas.

BRIEF DESCRIPTION OF THE DRAWINGS

FIG. 1 is a schematic sectional view showing a process example of this invention in accordance with a order of steps.

DETAILED DESCRIPTION OF THE INVENTION

Figure 1A:
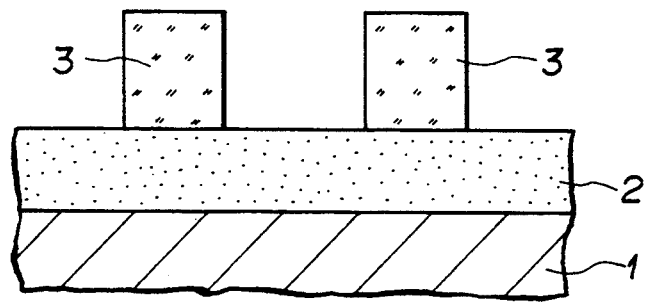
FIG. 1(a) shows a state which a resist mask is formed on a copper layer.

This invention shows a method for etching a copper layer in dry process while using a etching gas including iodine halide and heating a substrate.

This invention includes the steps of the first etching for etching a copper layer until it is just before an etched depth is the same as a thickness of the copper layer and the second etching for etching a residual copper while heating. The etching gas for the first etching includes a iodine halide. The etching gas for the second etching includes a iodine halide and bromide gas.

As iodine halide used in this invention, chemical compounds put into a etching chamber as a vapor is pratically preferable. Iodine Pentafuluoride (IF5), Iodine Heptafuluoride (IF7), Iodine Monochloride (IC1) or Iodine Trichloride (ICl3) is used. Iodine Pentafuluoride (IF5) and Iodine Monochloride (ICl) are liquid at room temperture. But as known the following data of vapor pressure, they are vaporized easily by means such as a helium gas bubbling.

Data of vapor pressure of IF5
1.75 Pa (10° C.); 3.5 Pa (21° C.); 10.5 Pa (40.7° C.); 17.5 Pa (51.2° C.); 35 Pa (66.7° C.); 133 Pa (102° C.)

Data of vapor pressure of IC1
1.75 Pa (9° C.); 3.5 Pa (20.1° C.); 10.5 Pa (39.2° C.); 17.5 Pa (49.2° C.); 35 Pa (64° C.); 133 Pa (97.8° C.)

This inventor thought that it was neccesary to use chemical species which didn't include oxygen and gave a reaction product of copper. The reaction product of copper has a pressure vapor which an elimination is possible in a wafer temperature range of not larger than 200° C. The inventor fixed the attention on iodine. The inventor also thought to utilize a reaction product having a low vapor pressure as a side wall protector.

CRC Handbook of Chemistry and Physics, 71st Edition, 6-51 (CRC Press Inc.), CRC Handbook of Chemistry and Physics, 53rd Edition, D-172 shows vapor pressure data of inorganic compound. It makes clear that the vapor pressure of cuprous iodide ($Cu_2I_2$) is lower than that of cuprous chloride ($Cu_2Cl_2$) or cuprous bromide ($Cu_2Br_2$) in the temperature range showing the vapor pressure of $1 \sim 760$ mmHG ($= 1.33 * 10^2 \sim 1.01 * 10^5$ Pa). In other words, the vapor pressure of cuprous iodide ($Cu_2I_2$) is higher than that of cuprous chloride ($Cu_2Cl_2$) or cuprous bromide ($Cu_2Br_2$) at the same temperature. The gas pressure on etching reaction system in dry process is generally pretty lower than the pressure range stated above. The simillar tendency is kept even shch a low pressure.

Iodine halide used in this invention is constituted by iodine and halogen. So when iodine halide is used as etching gas, cuprous iodide and another cuprous halide are produced at a time. If etching is performed in the temperature range which cuprous iodide is only eliminated, mainly a radical I* contributes as an etching nucleus. Other cuprous halides having lower vapor pressure build up at the pattern side wall which doesn't receive an ion shock. It works on a side attack of an ion or a radical as a protect layer.

Because the above-stated temperature range corresponds to a heat resistant temperature range of resist material, etching using a resist mask is possible.

Further this invention suggests a process which improves a selectivity of an under layer at an interface between a copper layer and an under layer. Namely in the step of the first etching for etching a copper layer until it is just before an etched depth is the same as a thickness of the copper layer, an iodine halide is used as an etching gas. In the step of the second etching for etching a residual copper, an iodine halide added a bromic compound is used as an etching gas. Generally an under layer is an interlaminar insulating layer such as $SiO_2$. When it is just after an exposure of an under layer is started by etching, a bromic compound is added into the etching gas. A bromine atom has a larger atomic diameter. It is difficult for bromine to extract a silicon atom because a binding energy between silicon and bromine is small. Therefore a selectivity on a under layer is improved.

In any case because oxygen does not relate to an etching reaction in this invention, there are no problems such as a production of copper oxide, an appearance of a copper spot or a copper oxide spot and an increase of a wiring resistance.

The exampes of this invention are explained as follows.

EXAMPLE 1

This is an example etching a copper layer while using a mixed gas of iodine monochloride (IC1) and argon (Ar) and a resist mask. This process is explained while refering to FIG. 1.

A wafer used as an etching sample in this invention is shown in FIG. 1(a). A copper layer 2 is formed on a silicon dioxide ($SiO_2$) interlaminar insulating layer 1. Further a resist mask 3 having a certain pattern is formed on the copper layer 2.

This wafer was set on a wafer stage in a magnetton reaction ion etching (RIE) apparatus. Here the wafer stage was heated at a certain temperature by a built-in heater. As an example, a copper layer 2 was etched by the following condition.

| | |
|---|---|
| iodine monochloride (IC1) flow rate | 35 SCCM |
| argon (Ar) flow rate | 35 SCCM |
| gas pressure | 2.0 Pa |
| RF power density | 1.0 W/cm$^2$ (13.56 MHz) |
| magnetic field intensity | $1.5*10^{-2}$ T ($=150$ G) |
| wafer temperature | 200° C. |

The wafer temperature stated above included a temperature rise caused by a plasma radiant heat and a reaction temperature. The temperature of the wafer became about 200° C. because of a heating of a built-in heater, a plasma radiant heat and a reaction temperature. In this etching process, cuprous iodide ($Cu_2I_2$) was produced by a reaction of radicals such as I$^+$, I* dissociated from iodine monochloride (IC1). Further this reaction product cuprous iodide ($Cu_2I_2$) imediately eliminated under a condition heating a wafer. Because a part of cuprous iodide ($Cu_2Cl_2$) produced at the same time didn't have enough vapor pressure to eliminate under the condition, it built up at a pattern side wall and formed a side wall protect layer. Ar or $Ar^+$ was added because an assist effect by an incident energy of Ar or $Ar^+$ was expected to increse a speed of etching.

Figure 1B:
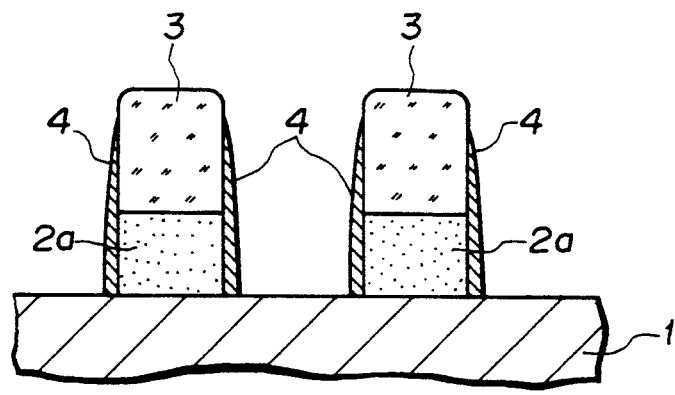
FIG. 1(b) shows a state which a copper wiring is formed by etching.

As this result, a copper wiring 2a having an anisotropic shape was formed as shown in FIG. 1(b). At this time, because oxygen didn't relate to the etching reaction, there was neither an appearance of a copper spot and/or a copper oxide spot nor an increase of a wiring resistance. Further because the wafer temperature was about 200° C., the resist mask 3 wasn't deformed by the heat.

EXAMPLE 2

This is an example etching a copper layer while using a mixed gas of iodine monochloride (ICl) and hydrogen iodide (HI).

At first, The wafer used in EXAMPLE 1 was set on a wafer stage in a magnetron reaction ion etching (RIE) apparatus. As an example, a copper layer 2 was etched by the following condition.

| | |
|---|---|
| iodine monochloride (ICl) flow rate | 35 SCCM |
| hydrogen iodide (HI) flow rate | 20 SCCM |
| gas pressure | 2.0 Pa |
| RF power density | 0.8 W/cm$^2$ (13.56 MHz) |
| magnetic field intensity | $1.5*10^{-2}$ T (=150 G) |
| wafer temperature | 200° C. |

Here, hydrogen iodide (HI) was used in the method for etching a copper layer in dry process which the inventor proposed in Japanese Patent Application No. HEI 4-96036. As compared with an interatomic bond energy, hydrogen iodide (HI) can produce hydrogen (H) more efficiently than other hydrogen halides such as hydrogen chloride and hydrogen bromide under a discharge dissociation condition. Because the produced hydrogen is incoperated into a decomposition product of a resist mask 3, a build-up of a carbon polymer is accelerated and it improves the selectivity. The inventor disclosed that a build-up of a carbon polymer was accelerated because of containing hydrogen in Japanese Patent Application NO. HEI 3-91544.

As this result, though an incident ion energy was decreased in comparison with EXAMPLE 1, an anisotropic etching was performed well.

EXAMPLE 3

This is an example etching a copper layer by two steps. After a copper was etched while using a mixed gas of iodine monochloride (ICl) and hydrogen iodide (HI), further the copper was etched while using a mixed gas of iodine monochloride (ICl) and hydrogen bromide (HBr). This process is explained while refering to FIG. 1 and FIG. 2.

As an example, a copper layer 2 was etched by the following condition.

| | |
|---|---|
| iodine monochloride (ICl) flow rate | 35 SCCM |
| hydrogen iodide (HI) flow rate | 20 SCCM |
| gas pressure | 2.0 Pa |
| RF power density | 1.2 W/cm$^2$ (13.56 MHz) |
| magnetic field intensity | $1.5*10^{-2}$ T (=150 G) |
| wafer temperature | 200° C. |

The etching mechanism on the first etching process was almost as stated in EXAMPLE 2. An etching of a copper layer 2 was stopped just before a silicon oxide ($SiO_2$) interlarninar insulating layer of an under layer was exposured. In the first etching process, a high speed etching was performed under a condition increased a RF power density Therefore the time required for the first etching became short. The time required for the first etching was most of time spent for etching. So the productivity was improved.

Figure 2:
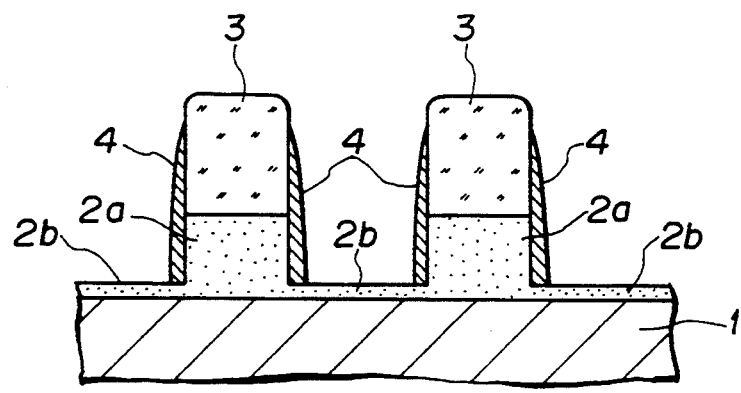
FIG. 2 is a schematic sectional view showing a state which the second etching of a copper layer has finished in another process example of this invention.

The copper wiring 2a having an anisotropic shape was almost completed by this etching as shown in FIG. 2. But a residual part 2b of the copper layer 2 was remained in the etched area.

Then the second etching for eliminating the residual part 2b was performed by the following condition, as one example.

| | |
|---|---|
| iodine monochloride (ICl) flow rate | 35 SCCM |
| hydrogen bromide (HBr) flow rate | 20 SCCM |
| gas pressure | 2.0 Pa |
| RF power density | 0.8 W/cm$^2$ (13.56 MHz) |
| magnetic field intensity | $1.5*10^{-2}$ T (=150 G) |
| wafer temperature | 200° C. |

In the second etching process, a bromine chemical nucleus was newly produced. Further because a RF power density was decreased as compared with the just-etching process, a dissociation of an etching gas was suppressed and an ion incident energy was decreased. Because of these reasons, the selective ratio of the silicon oxide ($SiO_2$) interlaminar insulating layer being an under layer was improved more than that of EXAMPLE 2.

Though this invention is explained while referring to the above stated three examples, this invention isn't limitted to these examples at all.

For instance, iodine pentafuluoride ($IF_5$) is used besides the above stated iodine monochloride (ICl) as an iodine halide.

Bromine ($Br_2$) or boron bromide ($BB_3$) is also used besides the above stated hydrogen bromide (HBr) as a bromide compound used with an iodine halide at the second etching.

Further it is possible to change a constitution of a wafer, an etching apparatus or an etching condition properly.

What is claimed is:

1. A method for etching a copper layer in dry process comprising the steps of:
    forming a copper layer on a substrate;
    heating said substrate;
    etching said copper layer while using an etching gas; and
    wherein said etching gas comprises an iodine halide.

2. A method for etching a copper layer in dry process according to claim 1, wherein said iodine halide is selected from the group consisting of iodine pentafuluoride, iodine heptafuluoride, iodine monochloride and iodine trichloride.

3. A method for etching a copper layer in dry process according to claim 1, wherein said copper layer is etched while sublimating cuprous iodide of a reaction product.

4. A method for etching a copper layer in dry process according to claim 1, wherein said copper layer is etched while building up a reaction product being cuprous fuluoride or cuprous chloride on said substrate as a side wall protect layer.

5. A method for etching a copper layer in dry process according to claim 1, wherein said heating temperature is not smaller than the temperature which cuprous iodide is sublimated and smaller than the temperature which cuprous fuluoride and cuprous chloride are sublimated.

6. A method for etching a copper layer in dry process according to claim 1, wherein said heating temperature is at a temperature of 150° C. to 220° C.

7. A method for etching a copper layer in dry process according to claim 1, further comprising the steps of forming a photo resist layer in a certain pattern on said copper layer and etching said copper layer while masking said copper layer with said photo resist layer.

8. A method for etching a copper layer in dry process comprising the steps of:
forming a copper layer on a substrate;
heating said substrate;
first etching for etching said copper layer until it is just before an etched depth is the same as a thickness of said copper layer while using an etching gas;
second etching for etching a residual copper while using an etching gas; and
wherein said etching gas for said first etching comprises iodine halide, said etching gas for said second etching comprises iodine halide and bromide gas.

9. A method for etching a copper layer in dry process according to claim 8, said bromide gas is selected from the group consisting of hydrogen bromide, bromine and boron tribromide.

10. A method for etching a copper layer in dry process according to claim 8, wherein said residual copper is etched while sublimating cuprous iodide of a reaction product.

11. A method for etching a copper layer in dry process according to claim 8, wherein said residual copper is etched while building up a reaction product selected from the group consisting of cuprous fuluoride, cuprous bromide and cuprous chloride on said substrate as a side wall protect layer.

12. A method for etching a copper layer in dry process according to claim 8, wherein said heating temperature is not smaller than the tempeture which cuprous iodide is sublimated and smaller than the temperature which cuprous fuluoride, cuprous chloride and cuprous bromide are sublimated.

13. A method for etching a copper layer in dry process according to claim 8, wherein said heating tempetature is at a temperature of 150° C. to 220° C.

14. A method for etching a copper layer in dry process according to claim 8, further comprising the steps of forming a photo resist layer in a certain pattern on said copper layer and etching said residual copper while masking said copper layer with said photo resist layer.

* * * * *